(12) United States Patent
Jeong et al.

(10) Patent No.: US 8,933,561 B2
(45) Date of Patent: Jan. 13, 2015

(54) SEMICONDUCTOR DEVICE FOR SEMICONDUCTOR PACKAGE HAVING THROUGH SILICON VIAS OF DIFFERENT HEIGHTS

(75) Inventors: SeYoung Jeong, Suwon-si (KR); Hogeon Song, Suwon-si (KR); Chungsun Lee, Gunpo-si (KR); Ho-Jin Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 570 days.

(21) Appl. No.: 13/211,574

(22) Filed: Aug. 17, 2011

(65) Prior Publication Data

US 2012/0091580 A1    Apr. 19, 2012

(30) Foreign Application Priority Data

Oct. 14, 2010    (KR) .................. 10-2010-0100467

(51) Int. Cl.
*H01L 23/48*    (2006.01)
*H01L 21/768*    (2006.01)
(Continued)

(52) U.S. Cl.
CPC ........ *H01L 23/481* (2013.01); *H01L 21/76898* (2013.01); *H01L 24/14* (2013.01); *H01L 24/17* (2013.01); *H01L 25/0657* (2013.01); *H01L 25/18* (2013.01); *H01L 25/50* (2013.01); *H01L 21/563* (2013.01); *H01L 23/3128* (2013.01); *H01L 24/04* (2013.01); *H01L 24/05* (2013.01); *H01L 24/13* (2013.01); *H01L 24/16* (2013.01); *H01L 24/32* (2013.01); *H01L 24/97* (2013.01); *H01L 2221/68372* (2013.01); *H01L 2224/0401* (2013.01); *H01L 2224/04042* (2013.01); *H01L 2224/0557* (2013.01); *H01L 2224/05624* (2013.01); *H01L 2224/05647* (2013.01); *H01L 2224/13009* (2013.01); *H01L 2224/13025* (2013.01); *H01L 2224/1403* (2013.01); *H01L 2224/16145* (2013.01); *H01L 2224/16227* (2013.01); *H01L 2224/32145* (2013.01); *H01L 2224/48227* (2013.01); *H01L 2224/97* (2013.01);
(Continued)

(58) Field of Classification Search
CPC . H01L 21/76898; H01L 23/481; H01L 24/14; H01L 24/17; H01L 25/0657; H01L 25/18; H01L 25/50
USPC .......................................... 257/737, E23.011
See application file for complete search history.

(56) References Cited

U.S. PATENT DOCUMENTS

2008/0123386 A1* 5/2008 Kang et al. ...................... 365/63
2008/0247116 A1* 10/2008 Kawano et al. ............... 361/302
(Continued)

FOREIGN PATENT DOCUMENTS

JP    2007250916 A    9/2007
KR    20070088046 A    8/2007
KR    20090011570 U    2/2009

*Primary Examiner* — Walter H Swanson
(74) *Attorney, Agent, or Firm* — Harness, Dickey & Pierce, P.L.C.

(57) ABSTRACT

Provided is a semiconductor device. The semiconductor device may include a first semiconductor chip that includes a first through silicon via having a first protrusion height and a second through silicon via having a second protrusion height greater than the first protrusion height which are penetrating at least a portion of the first semiconductor chip, a second semiconductor chip may be electrically connected to the first through silicon via, and a third semiconductor chip may be electrically connected to the second through silicon via.

19 Claims, 13 Drawing Sheets

(51) Int. Cl.
　　*H01L 23/00*　　(2006.01)
　　*H01L 25/065*　　(2006.01)
　　*H01L 25/18*　　(2006.01)
　　*H01L 25/00*　　(2006.01)
　　H01L 21/56　　(2006.01)
　　H01L 23/31　　(2006.01)
(52) U.S. Cl.
　　CPC .................. *H01L 2225/0651* (2013.01); *H01L 2225/06517* (2013.01); *H01L 2225/06544* (2013.01); *H01L 2225/06562* (2013.01); *H01L 2225/06568* (2013.01); *H01L 2924/01013* (2013.01); *H01L 2924/01029* (2013.01); *H01L 2924/01049* (2013.01); *H01L 2924/01079* (2013.01); *H01L 2924/1304* (2013.01); *H01L 2924/1431* (2013.01); *H01L 2924/1434* (2013.01); *H01L 2924/15311* (2013.01); *H01L 2924/19041* (2013.01); *H01L 2924/19043* (2013.01); *H01L 2924/19104* (2013.01); *H01L 24/48* (2013.01); *H01L 2924/01006* (2013.01); *H01L 2924/01033* (2013.01); *H01L 2924/01047* (2013.01); *H01L 2924/01074* (2013.01); *H01L 2924/01075* (2013.01); *H01L 2924/014* (2013.01); *H01L 2924/10253* (2013.01); *H01L 2224/16225* (2013.01)
　　USPC ........................................................ 257/737

(56) References Cited

U.S. PATENT DOCUMENTS

| | | | |
|---|---|---|---|
| 2009/0108469 A1* | 4/2009 | Kang et al. | 257/777 |
| 2010/0164084 A1* | 7/2010 | Lee et al. | 257/686 |
| 2010/0252935 A1* | 10/2010 | Lee et al. | 257/774 |
| 2011/0156232 A1* | 6/2011 | Youn et al. | 257/686 |

* cited by examiner

SEMICONDUCTOR DEVICE FOR SEMICONDUCTOR PACKAGE HAVING THROUGH SILICON VIAS OF DIFFERENT HEIGHTS

CROSS-REFERENCE TO RELATED APPLICATIONS

This U.S. non-provisional patent application claims priority under 35 U.S.C. §119 to Korean Patent Applications No. 10-2010-0100467, filed on Oct. 14, 2010, in the Korean Intellectual Property Office (KIPO), the entire contents of which are hereby incorporated by reference.

BACKGROUND

1. Field

Example embodiments relate to semiconductor devices and methods of fabricating the same, and more particularly, to semiconductor devices having a through silicon via and methods of fabricating the same.

2. Description of the Related Art

In the conventional art, the trend of electronic industries is to manufacture light weight, miniaturized, high-speed, multi-functional, and high-performance products at low cost. A multi-chip stacked package technology or a system-in-package technology is employed for achieving the above objects. The multi-chip stacked package technology or the system-in-package technology uses a through silicon via.

The multi-chip stacked package or the system-in-package can perform functions of a plurality of unit semiconductor devices in a single semiconductor package. Although the multi-chip stacked package or the system-in-package may be rather thick as compared to a typical single-chip package, a size of the multi-chip stacked package or the system-in-package is almost similar to that of the single-chip package in plan view. Therefore, the multi-chip stacked package or the system-in-package is mainly used in products such as a mobile phone, a notebook computer, a memory card, a portable camcorder or the like, which require small size and portability as well as high-performance.

SUMMARY

Example embodiments provide a semiconductor device having through silicon vias for stacking a plurality of semiconductor devices having different sizes. Example embodiments also provide a method of fabricating a semiconductor device having through silicon vias for stacking a plurality of semiconductor devices having different sizes. Example embodiments also provide a semiconductor package including the semiconductor device.

In accordance with example embodiments, a semiconductor device may include a first semiconductor chip having a first through silicon via and a second through silicon via, the first through silicon via having a first protrusion height and the second through silicon via having a second protrusion height different from the first protrusion height. In example embodiments, the first and second through silicon vias may penetrate at least a portion of the first semiconductor chip.

In accordance with example embodiments, a method of fabricating a semiconductor device may include: forming first and second through silicon vias penetrating at least a portion of a first semiconductor chip, the first through silicon via being formed to have a first protrusion height and the second through silicon via being formed to have a second protrusion height which is different from the first protrusion height; electrically connecting a second semiconductor chip to the first through silicon via; and electrically connecting a third semiconductor chip to the second through silicon via.

In accordance with example embodiments, a semiconductor device may include a first plurality of through vias extending from an upper surface of a first semiconductor chip to below a lower surface of the first semiconductor chip, and a second plurality of through vias extending from the upper surface of the first semiconductor chip to below the lower surface of the first semiconductor chip, wherein the second plurality of through vias are longer than the first plurality of through vias.

Example embodiments provide semiconductor devices that may include a first semiconductor chip including a first through silicon via having a first protrusion height and a second through silicon via having a second protrusion height different from the first protrusion height, the first and second vias penetrating at least a portion of the first semiconductor chip.

In example embodiments, the second protrusion height may be greater than the first protrusion height.

In example embodiments, the second through silicon via may be provided at a farther distance from a center of the first semiconductor chip than the first through silicon via.

In example embodiments, the second through silicon via may have a width greater than the first through silicon via.

In example embodiments, the semiconductor device may further include a second semiconductor chip electrically connected to the first through silicon via, and a third semiconductor chip electrically connected to the second through silicon via.

In example embodiments, a plan area of the third semiconductor chip may be larger than that of the second semiconductor chip.

In example embodiments, the semiconductor device may further include an adhesive material layer disposed between the second semiconductor chip and the third semiconductor chip.

In example embodiments, the first to third semiconductor chips may be different devices from one another among a non-volatile memory device, a dynamic random access memory (DRAM) device, and a logic device.

In example embodiments, the first semiconductor chip may further include a third through silicon via having a third protrusion height greater than the second protrusion height.

In example embodiments, the third through silicon via may be provided at a farther distance from the center of the first semiconductor chip than the second through silicon via.

In example embodiments, the semiconductor device may further include a fourth semiconductor chip electrically connected to the third through silicon via.

In example embodiments, a plan area of the fourth semiconductor chip may be larger than that of the third semiconductor chip.

In example embodiments, a method of fabricating a semiconductor device may include: forming first and second through silicon vias penetrating at least a portion of a first semiconductor chip; electrically connecting a second semiconductor chip to the first through silicon via; and electrically connecting a third semiconductor chip to the second through silicon via. The first through silicon via may have a first protrusion height, and the second through silicon via may have a second protrusion height differing from the first protrusion height.

In example embodiments, the second protrusion height may be greater than the first protrusion height.

In example embodiments, the second through silicon via may be formed at a farther distance from a center of the first semiconductor chip than the first through silicon via.

In example embodiments, the forming of the first and second through silicon vias penetrating at least the portion of the first semiconductor chip may include: preparing a substrate having a first surface and a second surface facing the first surface; forming a first photoresist pattern exposing the first surface of the substrate where a first via hole will be formed; forming the first via hole having a first depth by an etching process using the first photoresist pattern as a mask; removing the first photoresist pattern; forming a second photoresist pattern exposing the first surface of the substrate where a second via hole will be formed; forming the second via hole having a second depth different from the first depth by an etching process using the second photoresist pattern as a mask; removing the second photoresist pattern; forming the first and second through silicon vias filling the respective first and second via holes; and exposing the first and second through silicon vias by removing a portion of the substrate from the second surface of the substrate.

In example embodiments, the forming of the first and second through silicon vias penetrating at least the portion of the first semiconductor chip may include: preparing a substrate having a first surface and a second surface facing the first surface; forming a photoresist pattern exposing the first surface of the substrate where first and second via holes will be formed; forming the first and second via holes by an etching process using the photoresist pattern as a mask; removing the photoresist pattern; forming the first and second through silicon vias filling the respective first and second via holes; and exposing the first and second through silicon vias by removing a portion of the substrate from the second surface of the substrate. The photoresist pattern may have a first opening exposing the first surface of the substrate where the first via hole will be formed and a second opening exposing the first surface of the substrate where the second via hole will be formed, wherein widths of the first and second openings may be different from each other.

In example embodiments, the second via hole may be formed to have a width greater than the first via hole.

In example embodiments, the second via hole may be formed at a farther distance from a center of the first semiconductor chip than the first via hole.

In example embodiments, a plan area of the third semiconductor chip may be larger than that of the second semiconductor chip.

In example embodiments, the electrically connecting of the respective second and third semiconductor chips to the first and second through silicon vias may include: electrically connecting a pad of the second semiconductor chip to the first through silicon via; forming an adhesive material layer on a second surface facing a first surface where the pad of the second semiconductor chip is provided; and electrically connecting a pad of the third semiconductor chip to the second through silicon via. A first surface with the pad of the third semiconductor chip provided may be adhered to the second surface of the second semiconductor chip by the adhesive material layer.

In example embodiments, the electrically connecting of the respective second and third semiconductor chips to the first and second through silicon vias may include: forming an adhesive material layer on a first surface, where a pad of the third semiconductor chip is provided, in order not to cover the pad; mounting the second semiconductor chip on the adhesive material layer such that a second surface facing a first surface where a pad of the second semiconductor chip is provided faces the first surface with the pad of the third semiconductor chip; and electrically connecting the respective pads of the second and third semiconductor chips to the first and second through silicon vias at the same time.

In example embodiments, the method may further include forming a third through silicon via penetrating at least the portion of the first semiconductor chip, and electrically connecting a fourth semiconductor chip to the third through silicon via. The third through silicon via may be greater than the first and second protrusion heights.

In example embodiments, a plan area of the fourth semiconductor chip may be larger than that of the third semiconductor chip.

In example embodiments, the electrically connecting of the fourth semiconductor chip to the third through silicon via may include electrically connecting a pad of the fourth semiconductor chip to the third through silicon via. A first surface, where the pad of the fourth semiconductor chip is provided, may be adhered to the second surface, which faces the first surface where the pad of the third semiconductor chip is provided, through an adhesive material layer disposed therebetween.

In example embodiments, a semiconductor package may include a wiring board having a bonding pad provided at a first surface and a ball pad provided at a second surface facing the first surface, and a semiconductor device mounted on the first surface of the wiring board. The semiconductor device may include a first semiconductor chip including a first through silicon via having a first protrusion height and a second through silicon via having a second protrusion height higher than the first protrusion height which are penetrating at least a portion of the first semiconductor chip, a second semiconductor chip electrically connected to the first through silicon via, and a third semiconductor chip electrically connected to the second through silicon via, and one ends of the first and second through silicon vias, which face the other ends of the first and second through silicon vias electrically connected to the second and third semiconductor chips, may be electrically connected to the bonding pads of the wiring board.

In example embodiments, the semiconductor package may further include a solder ball provided on the ball pad of the wiring board.

In example embodiments, the other ends of the first and second through silicon vias and the bonding pads of the wiring board may be electrically connected by connection terminals.

In example embodiments, the other ends of the first and second through silicon vias and the bonding pads of the wiring board may be electrically connected by boding wires.

BRIEF DESCRIPTION OF THE DRAWINGS

The accompanying drawings are included to provide a further understanding of the inventive concepts, and are incorporated in and constitute a part of this specification. The drawings illustrate non-limiting example embodiments of the inventive concepts and, together with the description, serve to explain principles of the inventive concepts. In the drawings.

DETAILED DESCRIPTION OF EXAMPLE EMBODIMENTS

Figure 1:
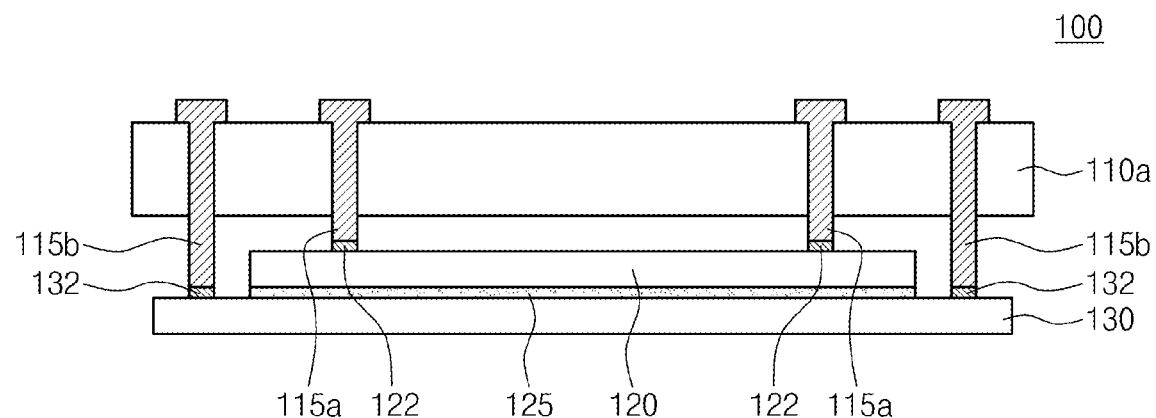
FIG. 1 is a cross-sectional view illustrating a semiconductor device according to example embodiments.

Hereinafter, example embodiments will be described in more detail with reference to the accompanying drawings. Advantages and features of example embodiments, and implementation methods thereof, will be clarified with reference to the accompanying drawings. The inventive concepts may, however, be embodied in different forms and should not be construed as limited to example embodiments as set forth herein. Rather, example embodiments are provided so that this disclosure will be thorough and complete, and will fully convey the scope of the inventive concepts to those skilled in the art, and the inventive concepts are only defined by scopes of claims. Like reference numerals refer to like elements throughout.

While specific terms are used in the specification, they are not used to limit the inventive concepts, but merely used to explain example embodiments. In the inventive concepts, the terms of a singular form may include plural forms unless otherwise specified. The meaning of "include," "comprise," "including," or "comprising," specifies a property, a region, a fixed number, a step, a process, an element and/or a component but does not exclude other properties, regions, fixed numbers, steps, processes, elements and/or components. Since example embodiments are provided below, the order of the reference numerals given in the description is not limited thereto. Further, in the specification, it will also be understood that when a layer (or film) is referred to as being 'on' another layer or substrate, it can be directly on the other layer or substrate, or intervening layers that may also be present.

Additionally, example embodiments in the detailed description will be described with sectional views and/or plan views as ideal exemplary views of the inventive concepts. In the drawings, the dimensions of layers and regions are exaggerated for clarity of illustration. Accordingly, shapes of the exemplary views may be modified according to manufacturing techniques and/or allowable errors. Therefore, example embodiments are not limited to the specific shape illustrated in the exemplary views, but may include other shapes that may be created according to manufacturing processes. For example, an etched region illustrated as a rectangle may have rounded or curved features. Areas exemplified in the drawings have general properties, and are used to illustrate a specific shape of a device region. Thus, this should not be construed as limited to the scope of the inventive concepts.

FIG. 1 is a cross-sectional view illustrating a semiconductor device according to example embodiments. For the simplicity of description, a semiconductor chip and a through silicon via will be mainly illustrated.

Referring to FIG. 1, a semiconductor device 100 according to example embodiments may include a first semiconductor chip 110a, a second semiconductor chip 120, and a third semiconductor chip 130. The first, second and third semiconductor chips 110a, 120 and 130 may include an integrated circuit (not shown). The integrated circuit may be provided inside the first, second and third semiconductor chips 110a, 120 and 130. The integrated circuit may be a circuit in which devices have a relatively high capacity, are integrated and systematized, and are stacked. In example embodiments, the integrated circuit may include a transistor or a memory device, though example embodiments are not limited thereto.

A pad 122 or 132, which is electrically connected to the integrated circuit, may be provided on the first, second, and/or third semiconductor chips 110a, 120 and/or 130. The pad 122 or 132 may be formed of aluminum (Al) or copper (Cu). When the pad 122 or 132 is Ruined of aluminum, the pad 122 or 132 may be provided on the integrated circuit. When the pad 122 or 132 is formed of copper, the pad 122 or 132 may have a damascene structure contained in the integrated circuit.

First and second through silicon vias 115a and 115b may be spaced apart from the integrated circuit of the first semiconductor chip 110a, and may be provided to penetrate the first semiconductor chip 110a. The first and second through silicon vias 115a and 115b may include a conductive material, for example, silver (Ag), gold (Au), copper (Cu), tungsten (W), or indium (In). The first and second through silicon vias 115a and 115b may be provided in a peripheral circuit region (not shown). Alternatively, when the first semiconductor chip 110a has the pad 122 or 132 like the second and third semiconductor chips 120 and 130, the first and second through silicon vias 115a and 115b may be formed to penetrate the pad 122 or 132, or to overlap with the pad 122 or 132.

Although not shown in the drawings, the second and third semiconductor chips 120 and 130 may also have through silicon vias (see 124 or 134 of FIG. 11) which penetrate these chips, respectively.

The first and second through silicon vias 115a and 115b may protrude from a surface of the first semiconductor chip 110a. The first and second through silicon vias 115a and 115b may have first and second protrusion heights which are different from each other. In example embodiments, the second protrusion height of the second through silicon via 115b may be greater than the first protrusion height of the first through silicon via 115a, among the first and second through silicon vias 115a and 115b which penetrate the first semiconductor chip 110a of the semiconductor device 100 as shown in FIG. 1. In example embodiments, the second through silicon via 115b may be provided at a farther distance from a center of the first semiconductor chip 110a than the first through silicon via 115a. That is, the first through silicon via 115a, which is located at the nearest distance from the center of the first semiconductor chip 110a, has the lowest first protrusion height, and the second through silicon via 115b, which is located at farther distance from the center of the first semiconductor chip 110a than the first through silicon via 115a, has the second protrusion height greater than the first protrusion height of the first through silicon via 115b. An additional through silicon via (see 115c of FIG. 7), which may be further provided, may have a third protrusion height greater than the second protrusion height of the second through silicon via 115b, wherein the additional through silicon via is provided at a farther distance from the center of the first semiconductor chip 110a than the second through silicon via 115b. As a result, the first semiconductor chip 110a may have a through silicon via structure in which the protrusion height is sequentially increased from the center to edges of the first semiconductor chip 110a.

The second and third semiconductor chips 120 and 130 may be electrically connected to the first and second through silicon vias 115a and 115b, respectively. The second and third semiconductor chips 120 and 130 may be electrically connected to the first and second through silicon vias 115a and 115b through the pads 122 and 132 provided on the second and third semiconductor chips 120 and 130, respectively. A plan area of the third semiconductor chip 130 may be larger than that of the second semiconductor chip 120. However, a plan area of the third semiconductor chip 130 may be equal to or smaller than that of the first semiconductor chip 110a. Between the second and third semiconductor chips 120 and 130, an adhesive material layer 125 for adhesion therebetween may be disposed.

Since the first semiconductor chip 110a has a through silicon via structure in which the protrusion height is sequentially increased from the center to the edges of the first semiconductor chip 110a, the semiconductor device 100 according to example embodiments may have a structure in which a plurality of semiconductor chips 120, 130, . . . having different sizes and functions are stacked on the first semiconductor chip 110a. Therefore, the semiconductor device 100, which includes the plurality of semiconductor chips 110a, 120, 130 . . . having various sizes and functions, may be provided.

For example, the first semiconductor chip 110a may be a non-volatile memory (NVM) device, the second semiconductor chip 120 may be a dynamic random access memory (DRAM) device, and the third semiconductor chip 130 may be a logic device. The semiconductor device 100 may include these first, second and third semiconductor chips 110a, 120 and 130 and may be used as an electronic system.

Also, for example, the first and second semiconductor chips 110a and 120 may be memory devices, and the third semiconductor chip 130 may be a wiring board, for example, a printed circuit board. The semiconductor device 100 including these first, second and third semiconductor chips 110a, 120 and 130 may be one exemplary configuration of a semiconductor package.

FIGS. 2A through 2E are cross-sectional views illustrating an example of a fabricating method of a semiconductor device according to example embodiments.

Figure 2A:
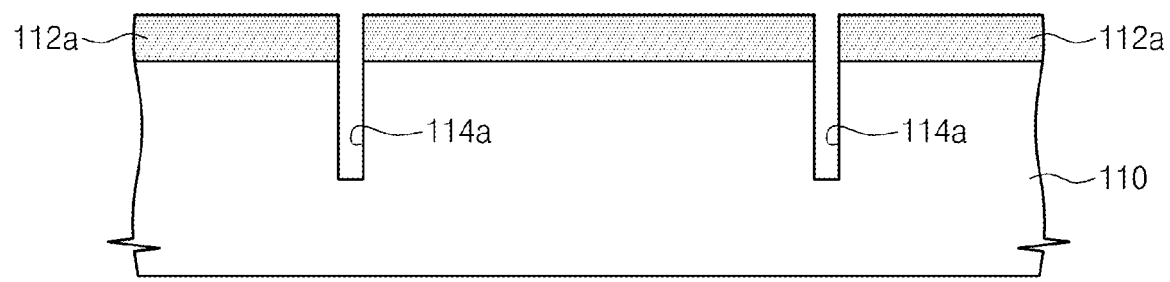
FIGS. 2A through 2E are cross-sectional views illustrating an example of a fabricating method of a semiconductor device according to example embodiments.

Referring to FIG. 2A, a substrate 110, which has a first surface and a second surface facing the first surface, is prepared. The substrate 110 may be a silicon (Si) wafer. The substrate 110 may include an integrated circuit (not shown) which may be formed at the inside thereof or at the first surface thereof. A pad (not shown) may be electrically connected to the integrated circuit and may be formed on the integrated circuit. For example, the pad may be formed of aluminum and the pad may be formed on the integrated circuit. As another example, the pad may be formed of copper and the pad may be formed in the shape of a damascene structure contained in the integrated circuit.

A first photoresist pattern 112a may be formed on the first surface of the substrate 110. The first photoresist pattern 112a may expose the first surface of the substrate 110 where a first via hole 114a will be formed.

The first via hole 114a, which is recessed up to a first depth from the first surface of the substrate 110, may be formed by an etching process using the first photoresist pattern 112a as a mask. The first via hole 114a may be formed in a peripheral circuit region (not shown). Alternatively, the first via hole 114a may be formed to penetrate the pad, or to overlap with the pad.

The first via hole 114a may be formed using dry etching, wet etching, drilling using a laser, or mechanical drilling. Since the first depth of the first via hole 114a may be greater than the thickness of the integrated circuit but smaller than the thickness of the substrate 110, the first via hole 114a may be spaced apart from the second surface of the substrate 110.

Figure 2B:
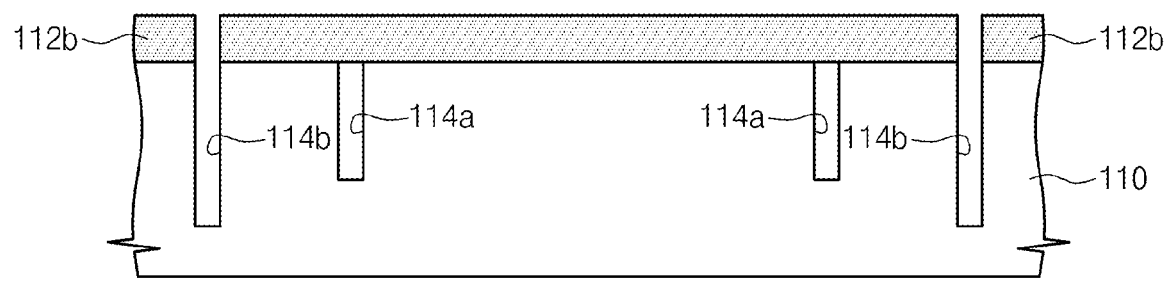

Referring to FIG. 2B, the first photoresist pattern 112a may be removed, and thereafter a second photoresist pattern 112b may be formed on the substrate 110 where the first via hole 114a is formed. The second photoresist pattern 112b may expose the first surface where a second via hole 114b will be formed.

The second via hole 114b, which may be recessed up to a second depth different from the first depth of the first via hole 114a from the first surface of the substrate 110, may be formed by an etching process using the second photoresist pattern 112b as a mask. The first and second via holes 114a and 114b according to example embodiments may have different depths from each other. In example embodiments, the second depth of the second via hole 114b may be greater than the first depth of the first via hole 114a. Therefore, the second via hole 114b may be formed at a farther distance from a center of each dies, which may be divided by a scribe lane region of the substrate 110, than the first via hole 114a. The second via hole 114b may be formed in the peripheral circuit region. Alternatively, the second via hole 114b may be formed to penetrate the pad, or to overlap with the pad.

The second via hole 114b may be formed using dry etching, wet etching, drilling using a laser, or mechanical drilling. Since the second depth of the second via hole 114b may be greater than the first depth of the first via hole 114a but smaller than the thickness of the substrate 110, the second via hole 114b may be spaced apart from the second surface of the substrate 110.

Figure 2C:
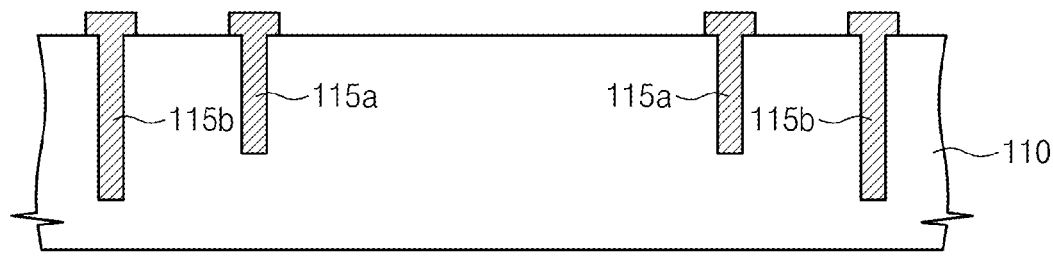

Referring to FIG. 2C, the second photoresist pattern 112b may be removed, and thereafter, first and second through silicon vias 115a and 115b filling the respective first and second via holes 114a and 114b may be formed. The forming of the first and second through silicon vias 115a and 115b may include filling the insides of the first and second via holes 114a and 114b with interconnection patterns for the through silicon via, and patterning the interconnection patterns.

The interconnection patterns for the through silicon vias may be formed in the first and second via holes 114a and 114b using an electroplating method, an electroless plating method, or a selective deposition method. The electroplating method may include forming a seed layer on inner surfaces of the respective first and second via holes 114a and 114b, and then plating the interconnection pattern for the through silicon vias using the seed layer. The seed layer may be formed by a sputtering method. The first and second through silicon vias 115a and 115b may include silver, gold, copper, tungsten, or indium.

Since the second depth of the second via hole 114b may be greater than the first depth of the first via hole 114a, the second through silicon via 115b may have a greater length than the first through silicon via 115a. The first and second through silicon vias 115a and 115b may extend onto the first surface of the substrate 110 in order to be electrically connected to the above-described pad, or may penetrate the pad or to overlap with the pad.

Although not shown in the drawings, at least one via hole may be further formed in the substrate 110. That is, an additional third via hole, which has a different depth from the first and second via holes 114a and 114b, may be formed in the substrate 110.

Figure 2D:
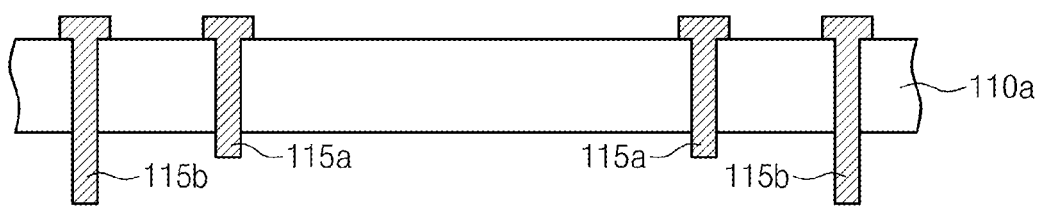

Referring to FIG. 2D, the first and second through silicon vias 115a and 115b may be exposed by removing a portion of the substrate 110 from the second surface of the substrate 110 where the first and second through silicon vias 115a and 115b are formed. The exposing of the first and second through silicon vias 115a and 115b may be performed by a two-step process. A first process may be a grinding process that may include attaching a carrier substrate (not shown) on the first surface of the substrate 110 using an adhesive layer (not shown), and grinding the second surface of the substrate 110 until the second surface of the substrate 110 approaches the second through silicon via 115b. A second process may be an etching process of selectively etching the second surface of the substrate 110 to allow the first and second through silicon vias 115a and 115b to protrude over the second surface of the substrate 110. The first process may use a grinding method, and the second process may use a wet etching or a dry etching method.

The carrier substrate may be used to relieve mechanical stress exerting on the substrate 110 during the first process of grinding the second surface of the substrate 110, and to prevent warpage of the substrate 110 thinned by the first process. The carrier substrate may include a glass substrate or a resin substrate. The adhesive layer bonding the carrier substrate to the first surface of the substrate 110 may include an ultraviolet adhesive or a thermoplastic adhesive, which may be a reworkable adhesive that is easy to be separated after adhesion.

Since the second through silicon via 115b may have a greater length than the first through silicon via 115a, a protrusion height of the second through silicon via 115b protruding from the second surface of the substrate 110 may be higher than that of the first through silicon via 115a.

The first and second through silicon vias 115a and 115b may be exposed from the second surface of the substrate 110, and, thereafter, the carrier substrate and the adhesive layer may be removed.

After exposing the first and second through silicon vias 115a and 115b from the second surface of the substrate 110, the substrate 110 may be cut along a scribe lane region of the substrate 110 through a substrate cutting apparatus. Resultantly, dies divided by the scribe lane region may be separated into the respective first semiconductor chips 110a.

Figure 2E:
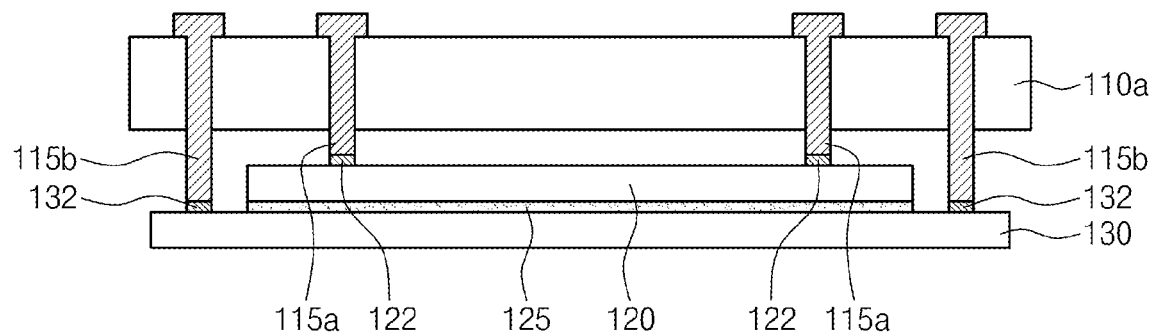

Referring to FIG. 2E, respective second and third semiconductor chips 120 and 130 may be electrically connected to the first and second through silicon vias 115a and 115b of the first semiconductor chip 110a. A plan area of the third semiconductor chip 130 may be larger than that of the second semiconductor chip 120.

In example embodiments, the second and third semiconductor chips 120 and 130 may be electrically connected to the first and second through silicon vias 115a and 115b, respectively, and the operation for electrically connecting the second and third semiconductor chips 120 and 130 to the first and second through silicon vias 115a and 115b may include: electrically connecting a pad 122 of the second semiconductor chip 120 to the first through silicon via 115a; forming an adhesive material layer 125 on a second surface facing a first surface where the pad 122 of the second semiconductor chip 120 is provided; and electrically connecting a pad 132 of the third semiconductor chip 130 to the second through silicon via 115b. A first surface, where the pad 132 of the third semiconductor chip 130 is provided, may be adhered to the second surface of the second semiconductor chip 120 by the adhesive material layer 125. Thus, the second and third semiconductor chips 120 and 130 may be sequentially attached to the first and second through silicon vias 115a and 115b.

Alternatively, the second and third semiconductor chips 120 and 130 may be electrically connected to the first and second through silicon vias 115a and 115b, respectively, by: forming the adhesive material layer 125 on the first surface, where the pad 132 of the third semiconductor chip 130 is provided, in order not to cover the pad 132; mounting the second semiconductor chip 120 on the adhesive material layer 125 such that the second surface facing the first surface where the pad 122 of the second semiconductor chip 120 is provided faces the first surface of the third semiconductor chip 130; and electrically connecting the respective pads 122 and 132 of the second and third semiconductor chips 120 and 130 to the first and second through silicon vias 115a and 115b at the same time.

As another example, before dividing the substrate into the respective first semiconductor chips 110a, the second and third semiconductor chips 120 and 130 may be electrically connected to the first and second through silicon vias 115a and 115b, respectively. The electrically connecting of the second and third semiconductor chips 120 and 130 to the first and second through silicon vias 115a and 115b respectively may include electrically connecting the second and third semiconductor chips 120 and 130 to the first and second through silicon vias 115a and 115b, respectively, using the above-described two methods. After the second and third semiconductor chips 120 and 130 are electrically connected to the first and second through silicon vias 115a and 115b respectively, the substrate 110 may be cut along the scribe lane region of the substrate 110 by a substrate cutting apparatus such that each of semiconductor devices (see 100 of FIG. 1) can be separated while dies divided by the scribe lane region are separated.

FIGS. 3A through 3D are cross-sectional views illustrating another example of a fabricating method of a semiconductor device according to example embodiments. The elements described in the fabricating method of the semiconductor device according to example embodiments use like reference numerals, and thus the detailed descriptions relating thereto will be omitted herein.

Figure 3A:
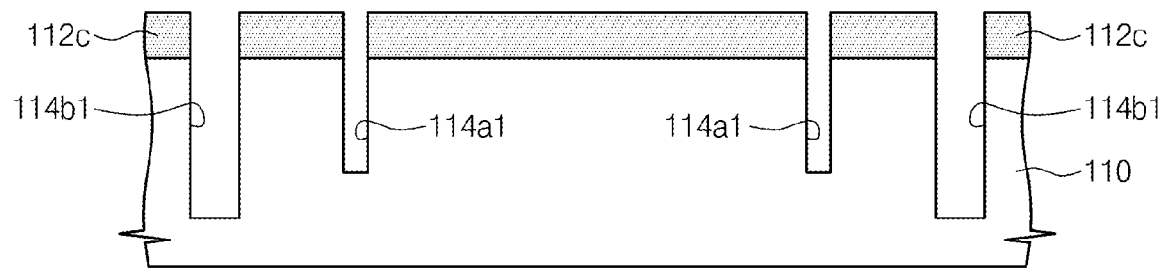
FIGS. 3A through 3D are cross-sectional views illustrating another example of a fabricating method of a semiconductor device according to example embodiments.

Referring to FIG. 3A, a substrate 110 having a first surface and a second surface facing the first surface is prepared. A photoresist pattern 112c is formed on the first surface of the substrate 110. The photoresist pattern 112c may expose the first surface of the substrate 110 where first and second via holes 114a1 and 114b1 will be formed.

The photoresist pattern 112c may have a first opening exposing the first surface of the substrate 110 where the first via hole 114a1 will be formed and a second opening exposing the first surface of the substrate 110 where the second via hole 114b1 will be formed. Widths of the first and second openings of the photoresist pattern 112c may be different from each other. In example embodiments, the width of the second opening, which exposes the first surface of the substrate 110 where the second via hole 114b1 will be formed, may be greater than that of the first opening which exposes the first surface of the substrate 110 where the first via hole 114a1 will be formed.

The first and second via holes 114a1 and 114b1, which may be recessed from the first surface of the substrate 110 by different depths from each other and may be formed by an etching process using the photoresist pattern 112c as a mask. In example embodiments, the recessing of the first and second via holes 114a1 and 114b1 to the different depths from each other by the etching process is because the substrate 110 has different etching rates due to the fact that the widths of the first and second openings of the photoresist pattern 112c are different from each other. The first and second via holes 114a1 and 114b1 according to example embodiments may have different depths and widths from each other. In example embodiments, a second depth of the second via hole 114b1 may be greater than a first depth of the first via hole 114a1, and the width of the second via hole 114b1 may be greater than the width of the first via hole 114a1. Therefore, the second via hole 114b1 may be formed at a farther distance than the first via hole 114a1 from the center of each die which may be divided by a scribe lane region of the substrate 110.

Since the first and second depths of the respective first and second via holes 114a1 and 114b1 may be greater than the thickness of the integrated circuit (not shown) but smaller than the thickness of the substrate 110, the first and second via holes 114a1 and 114b1 may spaced apart from the second surface of the substrate 110.

Although not shown in the drawings, an additional at least one via hole may be further formed in the substrate 110. That is, an additional third via hole having different depth and width from the first and second via holes 114a1 and 114b1 may be formed at the substrate 110.

Figure 3B:
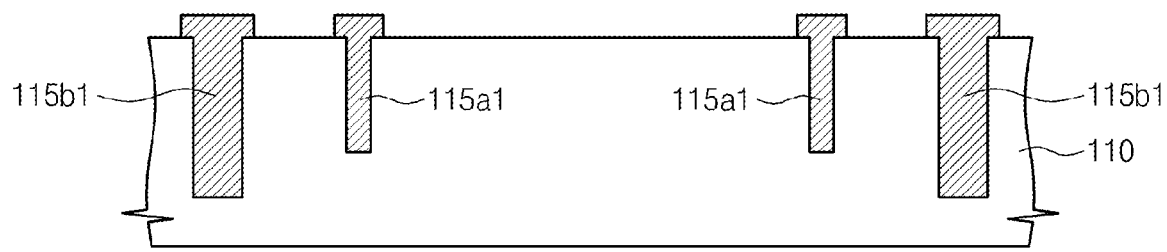

Referring to FIG. 3B, the photoresist pattern 112c may be removed and the first and second through silicon vias 115a1 and 115b1 may be formed by filling the respective first and second via holes 114a1 and 114b1 with a conductive material. The forming of the first and second through silicon vias 115a1 and 115b1 may include filling the insides of the first and second via holes 114a1 and 114b1 with interconnection patterns for the through silicon vias, and patterning the interconnection patterns.

Since the second depth of the second via hole 114b1 is greater than the first depth of the first via hole 114a1, the second through silicon via 115b1 may have a greater length than the first through silicon via 115a1.

Figure 3C:
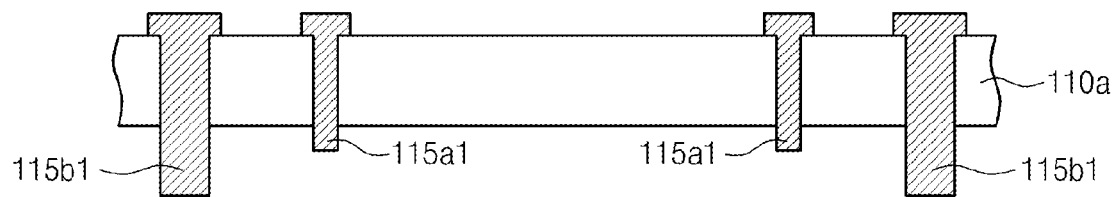

Referring to FIG. 3C, the first and second through silicon vias 115a1 and 115b1 may be exposed by removing a portion of the substrate 110 from the second surface of the substrate 110 where the first and second through silicon vias 115a1 and 115b1 are formed. The exposing of the first and second through silicon vias 115a1 and 115b1 may be performed by a two-step process. A first process may be a grinding process of grinding the second surface of the substrate 110 until the second surface of the substrate 110 approaches the second through silicon via 115b1 after attaching a carrier substrate (not shown) on the first surface of the substrate 110 using an adhesive layer (not shown). A second process may be an etching process of selectively etching the second surface of the substrate 110 in order for the first and second through silicon vias 115a1 and 115b1 to protrude over the second surface of the substrate 110.

Since the second through silicon via 115b1 may have a greater length than the first through silicon via 115a1, a protrusion height of the second through silicon via 115b1, which protrudes from the second surface of the substrate 110, may be higher than that of the first through silicon via 115a1.

After exposing the first and second through silicon vias 115a1 and 115b1 from the second surface of the substrate 110, the carrier substrate and the adhesive layer may be removed.

After the exposing of the first and second through silicon vias 115a1 and 115b1 from the second surface of the substrate 110, the substrate 110 may be cut along the scribe lane region of the substrate 110 by a substrate cutting apparatus such that each of first semiconductor chips 110a may be separated by separating dies divided by the scribe lane region.

Figure 3D:
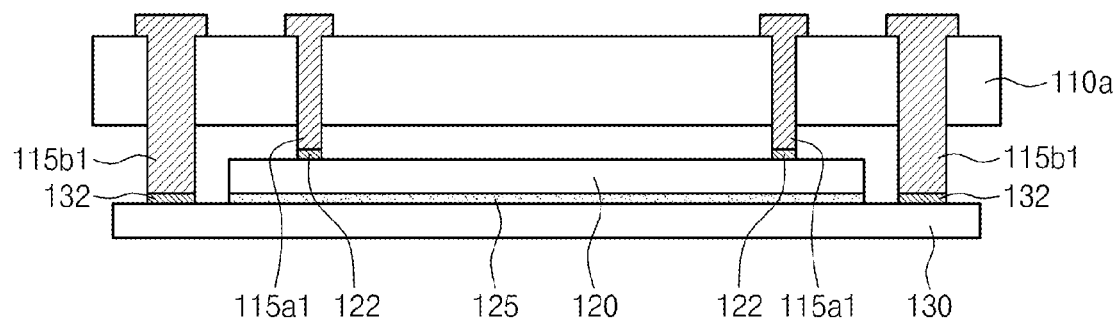

Referring to FIG. 3D, second and third semiconductor chips 120 and 130 may be electrically connected to the first and second through silicon vias 115a1 and 115b1 of the first semiconductor chip 110a, respectively. A plan area of the third semiconductor chip 130 may be larger than that of the second semiconductor chip 120.

In example embodiments, the second and third semiconductor chips 120 and 130 may be electrically connected to the first and second through silicon vias 115a1 and 115b1 by: electrically connecting a pad 122 of the second semiconductor chip 120 to the first through silicon via 115a1; forming an adhesive material layer 125 on a second surface of the second semiconductor chip 120 that faces a first surface of the second semiconductor chip 120 where the pad 122 is provided; and electrically connecting a pad 132 of the third semiconductor chip 130 to the second through silicon via 115b1. At this time, a first surface of the third semiconductor 130 where the pad 132 is provided may be adhered to the second surface of the second semiconductor chip 120 by the adhesive material layer 125.

Alternatively, the second and third semiconductor chips 120 and 130 may be electrically connected to the first and second through silicon vias 115a1 and 115b1 respectively by: forming the adhesive material layer 125 on the first surface of the third semiconductor chip 130 where the pad 132 is formed, the adhesive material layer 125 being provided so as not to cover the pad 132; mounting the second semiconductor chip 120 on the adhesive material layer 125 such that the second surface of the second semiconductor chip 120 facing the first surface of the second semiconductor chip 120 where the pad 122 is provided faces the first surface of the third semiconductor chip 130; and electrically connecting the respective pads 122 and 132 of the second and third semiconductor chips 120 and 130 to the first and second through silicon vias 115a1 and 115b1 at the same time.

As another example, before dividing the substrate into the respective first semiconductor chips 110a, the second and third semiconductor chips 120 and 130 may be electrically connected to the first and second through silicon vias 115a1 and 115b1, respectively. The second and third semiconductor chips 120 and 130 may be electrically connected to the first and second through silicon vias 115a1 and 115b1 by connecting the second and third semiconductor chips 120 and 130 to the first and second through silicon vias 115a1 and 115b1, respectively, using the above-described two methods. After the second and third semiconductor chips 120 and 130 are electrically connected to the first and second through silicon vias 115a1 and 115b1 respectively, the substrate 110 may be cut along the scribe lane region of the substrate 110 by a substrate cutting apparatus such that each of semiconductor devices can be separated while dies divided by the scribe lane region are separated.

Figure 4:
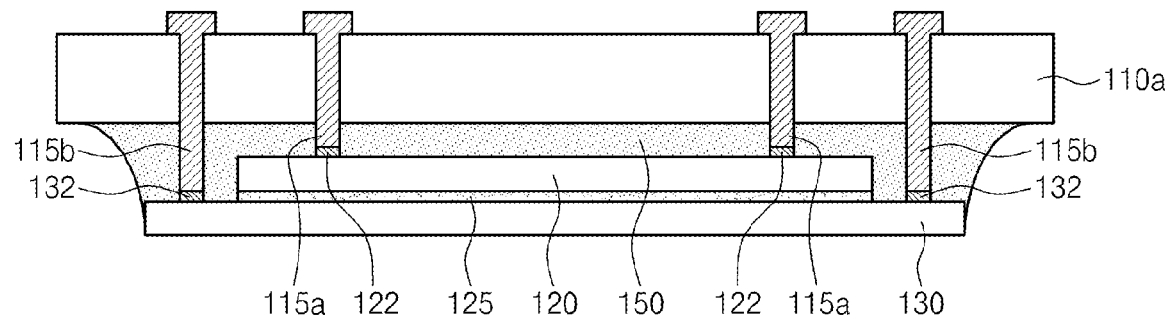
FIG. 4 is a cross-sectional view illustrating a semiconductor device according to example embodiments.

FIG. 4 is a cross-sectional view illustrating a semiconductor device according to example embodiments. In FIG. 4, the elements illustrated therein are like the previously described elements, thus the detailed descriptions relating thereto will be omitted for the sake of brevity.

A difference between a semiconductor device according to example embodiments as described with reference to FIG. 4 and the semiconductor device 100 of FIG. 1, is that the semiconductor device of FIG. 4 has a structure which further includes a underfill material 150 provided between the first semiconductor chip 110a and the second and third semiconductor chips 120 and 130 electrically connected thereto.

The underfill material 150 may fill a space between the first semiconductor chip 110a and the second and third semiconductor chips 120 and 130 electrically connected thereto as well as covering side surfaces of the second and third semiconductor chips 120 and 130. The underfill material 150 may be formed by hardening a resin in a liquid state which was injected between the first semiconductor chip 110a and the second and third semiconductor chips 120 and 130 electrically connected thereto.

Figure 5:
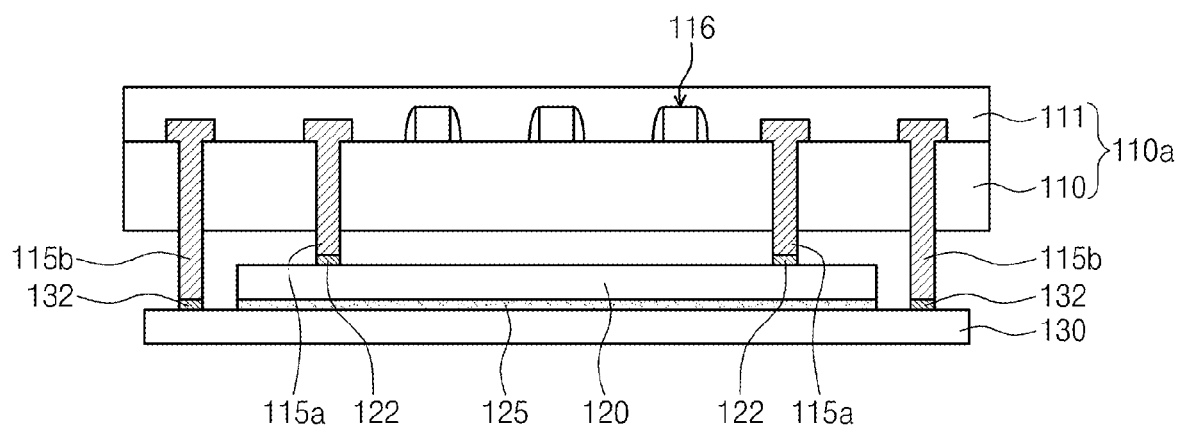
FIG. 5 is a cross-sectional view illustrating a semiconductor device according to example embodiments.

FIG. 5 is a cross-sectional view illustrating a semiconductor device according to example embodiments. In FIG. 5, the forgoing described elements use like reference numerals, and thus the detailed descriptions relating thereto will be omitted herein.

One difference between a semiconductor device described with reference to FIG. 5 and the semiconductor device 100 of FIG. 1 is that the semiconductor device of FIG. 5 has a structure in which the first and second through silicon vias 115a and 115b of the first semiconductor chip 110a penetrate a portion of the first semiconductor chip 110a.

A semiconductor chip 110a may include an integrated circuit 116 formed on the first surface of the substrate 110. A type of the integrated circuit 116 may be changed depending on a type of the semiconductor chip 110a. For example, the integrated circuit 116 may include at least one selected from the group consisting of a memory circuit, a logic circuit, or combinations thereof. The integrated circuit 116 may include a transistor or a memory device. Also, the integrated circuit 116 may be a passive device including a resistor or a capacitor. The integrated circuit 116 may be protected from the outside by an insulation layer 111.

The first and second through silicon vias 115a and 115b may be formed to penetrate the substrate 110 before the integrated circuit 116 is formed. The first and second through silicon vias 115a and 115b may be electrically connected to the integrated circuit 116 by an interconnection pattern (not shown) provided in the insulation layer 111.

The through silicon vias of the first semiconductor chip of the semiconductor device (see 100 of FIG. 1) according to example embodiments may be formed to penetrate the semiconductor chip after forming the semiconductor chip. In the alternative, the first and second through silicon vias 115a and 115b of the semiconductor chip 110a of the semiconductor device according to example embodiments may be formed to penetrate the substrate 110, which may be a portion of the semiconductor chip 110a, in the middle of forming the semiconductor chip.

Figure 6:
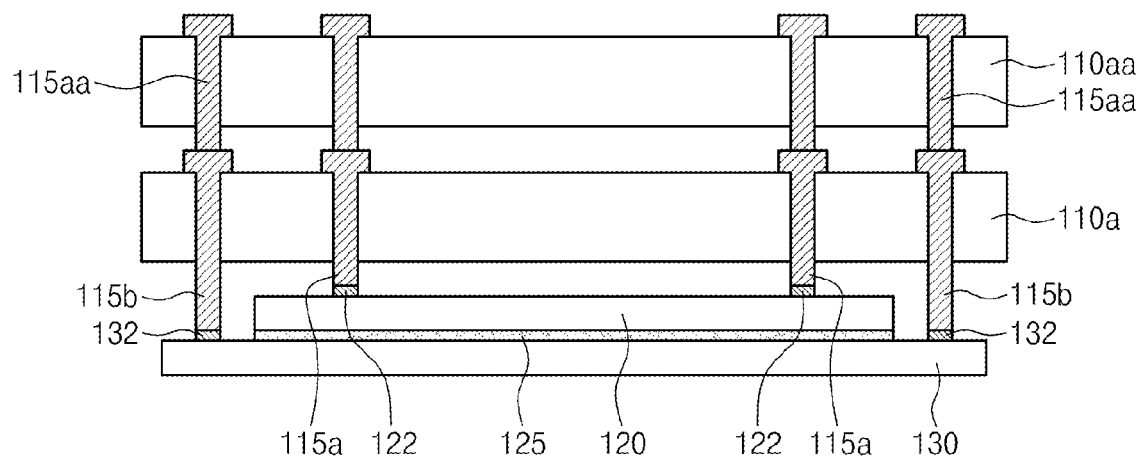
FIG. 6 is a cross-sectional view illustrating a semiconductor device according to example embodiments.
Figure 7:
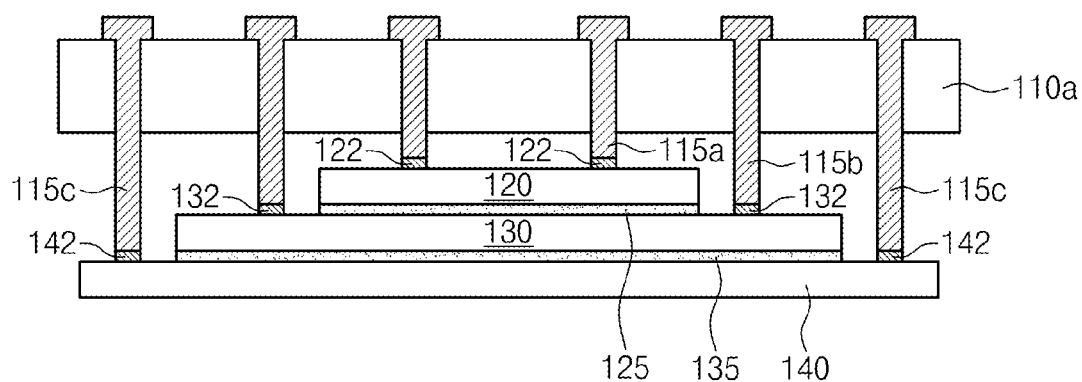
FIG. 7 is a cross-sectional view illustrating a semiconductor device according to example embodiments.

FIGS. 6 and 7 are cross-sectional views illustrating semiconductor devices according to example embodiments. In FIGS. 6 and 7, the elements described above use like reference numerals, and thus the detailed descriptions relating thereto will be omitted herein.

A difference between a semiconductor device illustrated in FIG. 6 and the semiconductor device 100 of FIG. 1 is that the semiconductor device of FIG. 6 has a structure which further includes an additional first semiconductor chip 110aa.

The additional first semiconductor chip 110aa may have a similar structure to the first semiconductor chip 110a. However, in example embodiments, all through silicon vias 115aa of the additional first semiconductor chip 110aa may have the same protrusion heights, which is different from the case of the first semiconductor chip 110a. The additional first semiconductor chip 110aa may be electrically connected to one ends of the first and second through silicon vias 115a and 115b, which face the other ends of the first and second through silicon vias 115a and 115b electrically connected to the second and third semiconductor chips 120 and 130, by stacking through the through silicon via 115aa.

When the first semiconductor chip 110a and the additional first semiconductor chip 110aa are memory devices, a high-capacity semiconductor device may be achieved.

A difference between a semiconductor device illustrated in FIG. 7 and the semiconductor device 100 of FIG. 1 is that the first semiconductor chip 110a has a structure which further includes a third through silicon via 115c.

The third through silicon via 115c may be provided at a farther distance than the second through silicon via 115b from the center of the first semiconductor chip 110a, and may have a third protrusion height greater than the second protrusion height of the second through silicon via 115b. As a result, the first semiconductor chip 110a may have a through silicon via structure in which the protrusion height is sequentially increased from the center to the edges of the first semiconductor chip 110a.

A fourth semiconductor chip 140 may be electrically connected to the third through silicon via 115c. The fourth semiconductor chip 140 may be electrically connected to the third through silicon via 115c through a pad 142 provided on the fourth semiconductor chip 140. A plan area of the fourth semiconductor chip 140 may be larger than that of the third semiconductor chip 130. An adhesive material layer 135 for adhering the third and fourth semiconductor chips 130 and 140 may be disposed therebetween.

When the fourth semiconductor chip 140 is a device having different size and function from the first, second and third semiconductor chips 110a, 120 and 130 one another, a highly integrated and multi-functional semiconductor device may be achieved.

Figure 8:
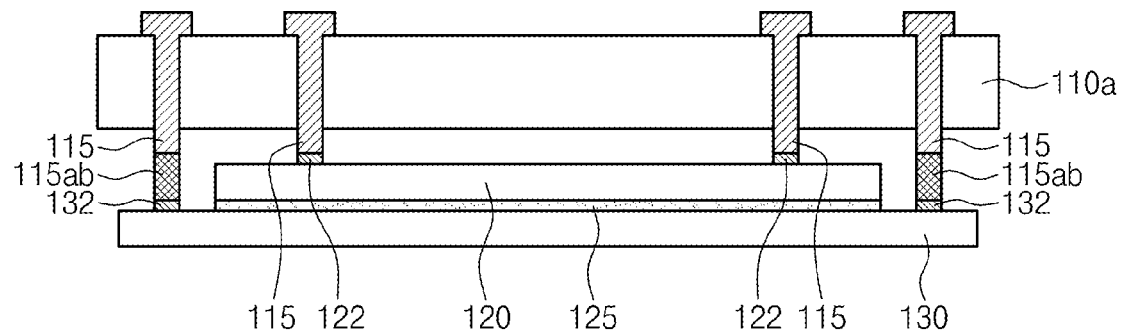
FIG. 8 is a cross-sectional view illustrating a semiconductor device according to example embodiments.

FIG. 8 is a cross-sectional view illustrating a semiconductor device according to example embodiments. In FIG. 8, the elements illustrated therein use like reference numerals, and the thus detailed descriptions relating thereto will be omitted herein.

A difference between a semiconductor device as illustrated in FIG. 8 and the semiconductor device 100 of FIG. 1 is that the first semiconductor chip 110a has a structure which includes through silicon vias 115 having the same protrusion heights.

All through silicon vias 115 of the first semiconductor chip 110a have the same protrusion heights. However, a bump 115ab is additionally provided to the through silicon via 115 located at a farther distance from the center of the first semiconductor chip 110a, thereby resulting in a protrusion height difference between the through silicon via 115 adjacent to the center of the first semiconductor chip 110a and the through silicon via 115 with the added bump 115ab located at a farther distance from the center of the first semiconductor chip 110a. Therefore, the second semiconductor chip 120 may be electrically connected to the through silicon via 115 having a small protrusion height adjacent to the center of the first semiconductor chip 110a, and third semiconductor chip 130 may be electrically connected to the through silicon via 115 with the added bump 115ab having a large protrusion height located at a farther distance from the center of the first semiconductor chip 110a.

Figure 16:
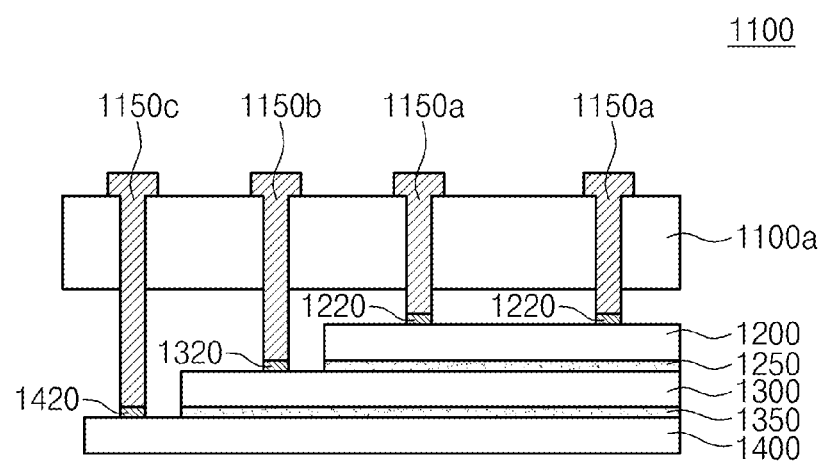
FIG. 16 is a cross-sectional view illustrating a semiconductor device according to example embodiments.

FIG. 16 is another example of a semiconductor device 1100 according to example embodiments. In FIG. 16, the semiconductor device 1100 includes a first semiconductor chip 1100*a*, a second semiconductor chip 1200, a third semiconductor chip 1300, and a fourth semiconductor chip 1400. Although the semiconductor device 1100 is illustrated as having four semiconductor chips (1100*a*, 1200, 1300, and 1400) example embodiments are not limited thereto as the semiconductor device 1100 may have more than four semiconductor chips or less than four semiconductor chips.

In example embodiments, through silicon vias may be formed to extend through the first semiconductor chip 1100*a*. For example, FIG. 16 shows a first plurality of through vias 1150*a*, a second plurality of through vias 1150*b* (noting only one is shown in FIG. 16), and a third plurality of through vias 1150*c* (noting only one is shown in FIG. 16). Although the through vias 1150*a*, 1150*b*, and 1150*c* are described as being a plurality of through vias, example embodiments are not limited thereto as the through vias may exist in singular.

As shown in FIG. 16, the first plurality of through vias 1150*a* may extend through the first semiconductor chip 1100*a* to contact a plurality of pads 1220 formed on an upper surface of the second semiconductor chip 1200. Likewise, the second and third pluralities of through vias 1150*b* and 1150*c* may extend through the first semiconductor chip 1100*a* to contact pads 1320 and 1420 formed respectively on upper surfaces of the third and fourth semiconductor chips 1300 and 1400. In example embodiments, the fourth semiconductor chip 1400 may be bonded to the third semiconductor chip 1300 by an adhesive layer 1250. Likewise, the third semiconductor chip 1300 may be bonded to the second semiconductor chip 1200 by another adhesive layer 1250.

In FIG. 16, the length of the through vias 1150*a*, 1150*b*, and 1150*c* may vary along a length of the first semiconductor chip 1100*a*. Thus, example embodiments may be configured to accommodate a skewed stack of semiconductor chips as shown in FIG. 16.

Figure 9:
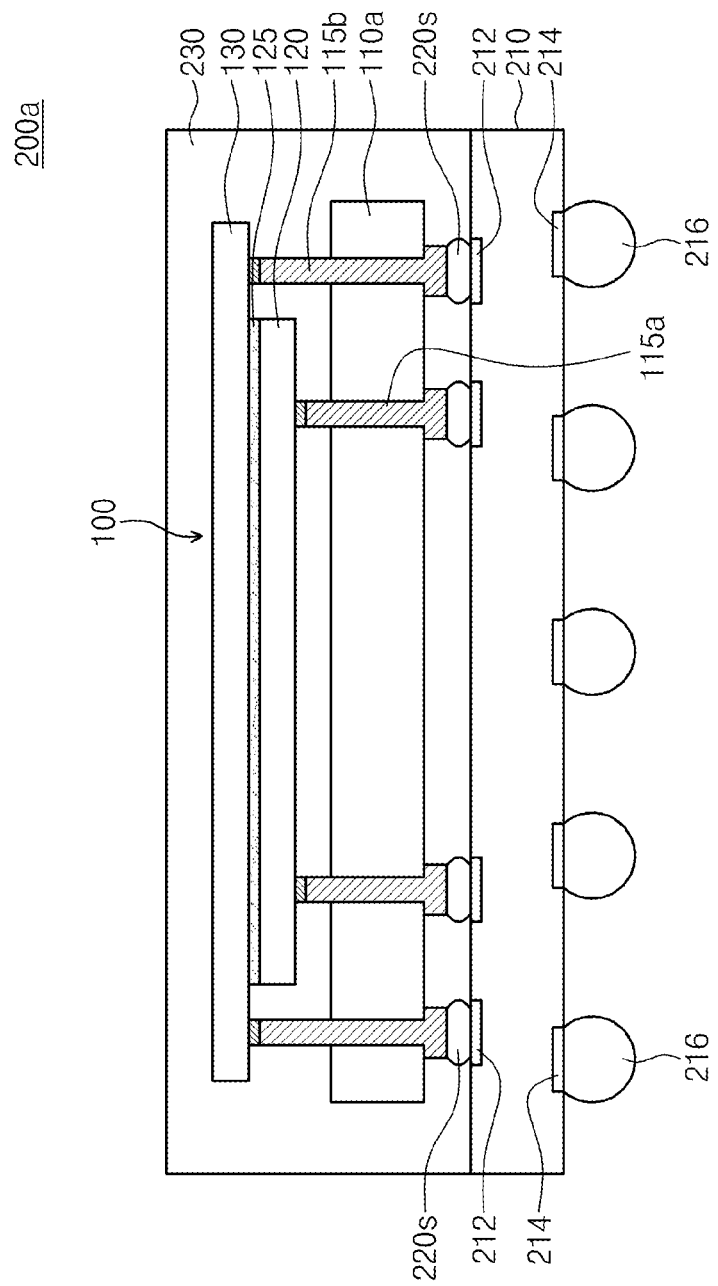
FIGS. 9 through 11 are cross-sectional views illustrating semiconductor packages according to example embodiments.
Figure 10:
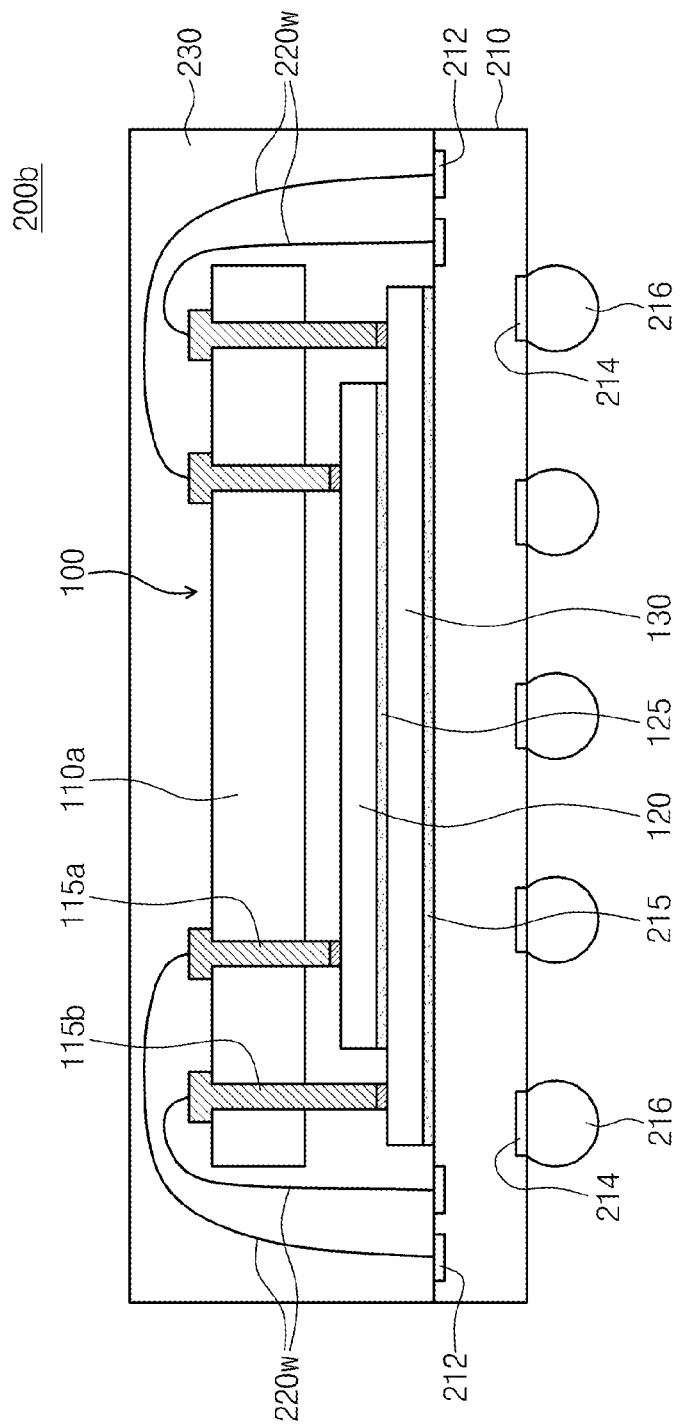
Figure 11:
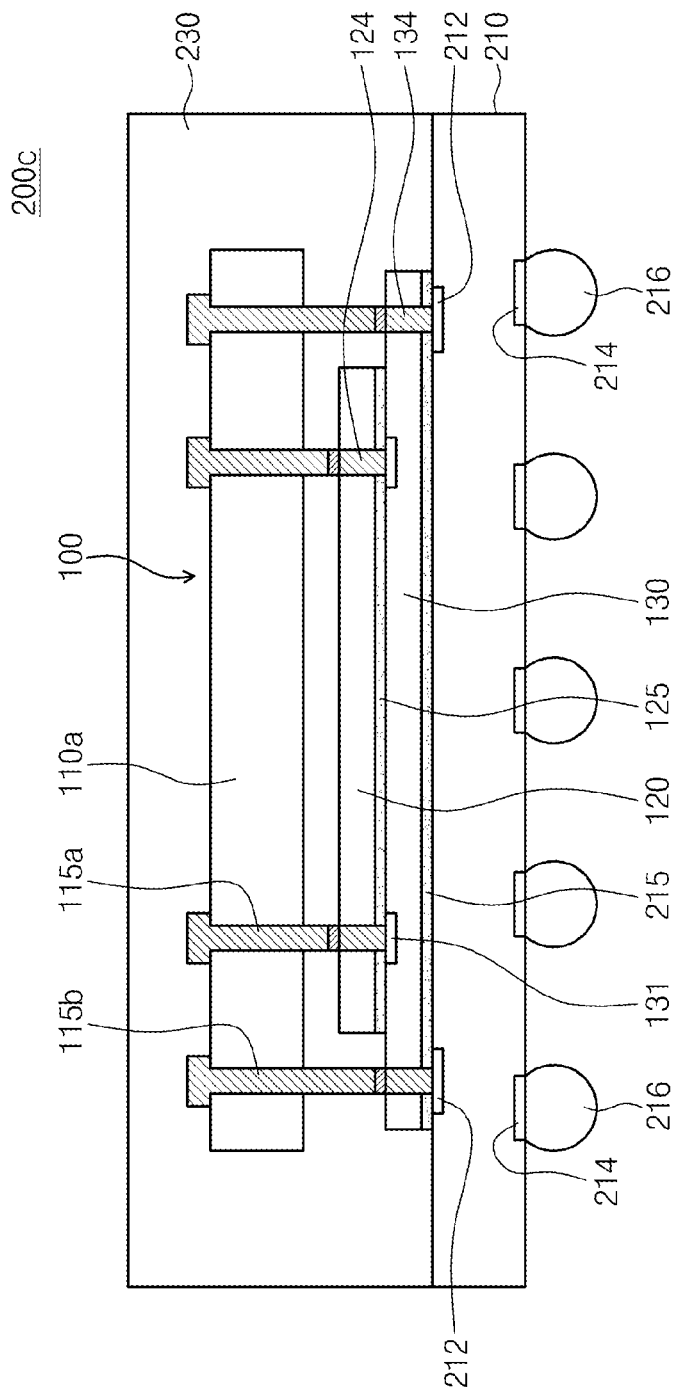

FIGS. 9 through 11 are cross-sectional views illustrating semiconductor packages according to example embodiments.

Referring to FIG. 9, a semiconductor package 200*a* includes a semiconductor device 100, a wiring board 210, a connection terminal 220*s*, and a molding layer 230. The embodiment described with reference to FIG. 1 may be applied to the semiconductor device 100. Accordingly, the semiconductor device 100 may include a first semiconductor chip 110*a* which includes a first through silicon via 115*a* having a first protrusion height and a second through silicon via 115*b* having a second protrusion height greater than the first protrusion height, a second semiconductor chip 120 electrically connected to the first through silicon via 115*a*, and a third semiconductor chip 130 electrically connected to the second through silicon via 115*b*.

The wiring board 210 may include a bonding pad 212 at an upper surface thereof, and a ball pad 214 at a lower surface thereof, wherein the bonding pad 212 and the ball pad 214 are connected to a circuit pattern (not shown) therein. The semiconductor device 100 may be mounted on the upper surface of the wiring board 210. The wiring board 210 may be a printed circuit board. The bonding pads 212 of the wiring board 210 may be electrically connected to the first and second through silicon vias 115*a* and 115*b* of the first semiconductor chip 110*a* of the semiconductor device 100. A solder ball 216 for electrical connection of an external circuit may be provided to the ball pad 214 of the wiring board 210.

In the semiconductor device 100, one ends of the first and second through silicon vias 115*a* and 115*b* (an example of first ends), which face the other ends (an example of second ends) of the first and second through silicon vias 115*a* and 115*b* electrically connected to the second and third semiconductor chips 120 and 130, may be electrically connected to the bonding pads 212 of the wiring board 210 through the connection terminals 220*s*. That is, the semiconductor device 100 may be mounted on the upper surface of the wiring board 210 in a flip chip (F/C) form. The connection terminal 220*s* may be one selected from the group consisting of a conductive bump, a solder ball, a conductive spacer, and a pin grid array (PGA) and combinations thereof.

The molding layer 230 may cover the upper surface of the wiring board 210 and the semiconductor device 100. The molding layer 230 may include an epoxy molding compound (EMC).

Although not shown in the drawings, an underfill material (see 150 of FIG. 4) may be further provided, which fills a space between the first semiconductor chip 110*a* and the second and third semiconductor chips 120 and 130 electrically connected thereto as well as covering side surfaces of the second and third semiconductor chips 120 and 130.

Referring to FIG. 10, a semiconductor package 200*b* may include a semiconductor device 100, a wiring board 210, a bonding wire 220*w*, and a molding layer 230. The detailed description for the same configuration as FIG. 9 will be omitted for the simplicity of the description, and the description will be focused on the difference.

The semiconductor device 100 may be mounted on the upper surface of the wiring board 210 by the medium of an adhesive material layer 215. The second surface of the third semiconductor chip 130 of the semiconductor device 100 may be adhered onto the wiring board 210 by the medium of the adhesive material layer 215. The bonding pads 212 of the wiring board 210 may be electrically connected to the first and second through silicon vias 115*a* and 115*b* of the first semiconductor chip 110*a* of the semiconductor device 100. In the semiconductor device 100, ends of the first and second through silicon vias 115*a* and 115*b*, which face the other ends of the first and second through silicon vias 115*a* and 115*b* electrically connected to the second and third semiconductor chips 120 and 130, may be connected to the bonding pads 212 of the wiring board 210 through the bonding wires 220*w*.

Referring to FIG. 11, a semiconductor package 200*c* may include a semiconductor device 100, a wiring board 210, a connection terminal (not shown), and a molding layer 230. The detailed description for the same configuration as FIG. 9 will be omitted for the simplicity of the description, and the description will be focused on the difference.

The second and third semiconductor chips 120 and 130 may have through silicon vias 124 and 134, respectively. The through silicon via 124 of the second semiconductor chip 120 may be electrically connected to the first through silicon via 115*a* of the first semiconductor chip 110*a*, and the through silicon via 134 of the third semiconductor chip 130 may be electrically connected to the second through silicon via 115*b* of the first semiconductor chip 110*a*. The through silicon via 124 of the second semiconductor chip 120 may be connected to a bonding pad 131 of the third semiconductor chip 130, thereby enabling an electrical connection between the second semiconductor chip 120 and the third semiconductor chip 130. This is because that an interconnection pattern (not shown), which may be provided inside the third semiconductor chip 130, may electrically connect the bonding pad 131 of the third semiconductor chip 130 and the through silicon via 134 to each other. The connection terminal (see 220*s* of FIG. 9) may be further provided between one end of the through silicon via 124 of the second semiconductor chip 120 and one end of the bonding pad 131 of the third semiconductor chip 130 electrically connected thereto.

In the semiconductor device 100, one end of the through silicon via 134, which faces the other end of the through silicon via 134 of the third semiconductor chip 130 electrically connected to the second through silicon via 115b of the first semiconductor chip 110a, may be connected to the bonding pad 212 of the wiring board 210. The connection terminal (see 220s of FIG. 9) may be further provided between the one end of the through silicon via 134 of the third semiconductor chip 130 and the bonding pad 212 of the wiring board 210. That is, the semiconductor device 100 may be mounted on the upper surface of the wiring board 210 in a flip chip form.

Figure 17:
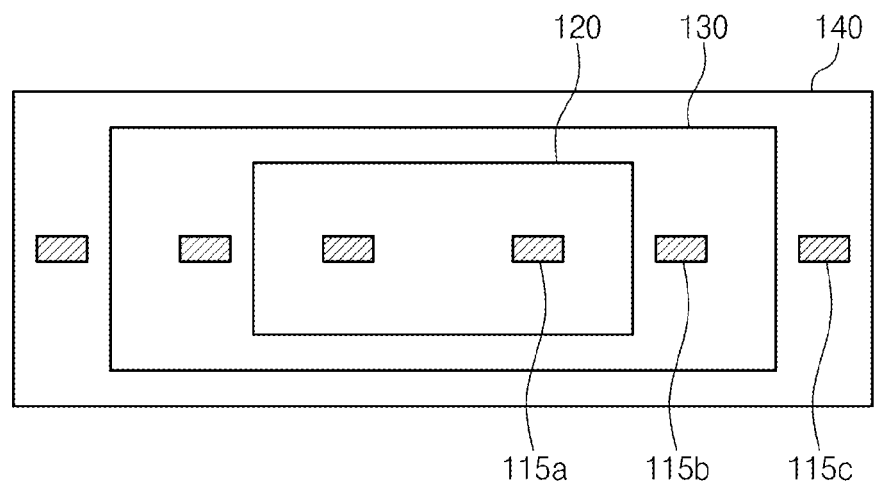
FIG. 17 is a top view of a semiconductor device according to example embodiments.

FIG. 17 is a top view of a semiconductor device according to example embodiments. FIG. 17 illustrates the second semiconductor chip 120, the third semiconductor chip 130 and the fourth semiconductor chip 140. The second, third and fourth semiconductor chips 120, 130 and 140 may be electrically connected to the first semiconductor chip through silicon vias 115a, 115b and 115c, respectively.

Figure 12:
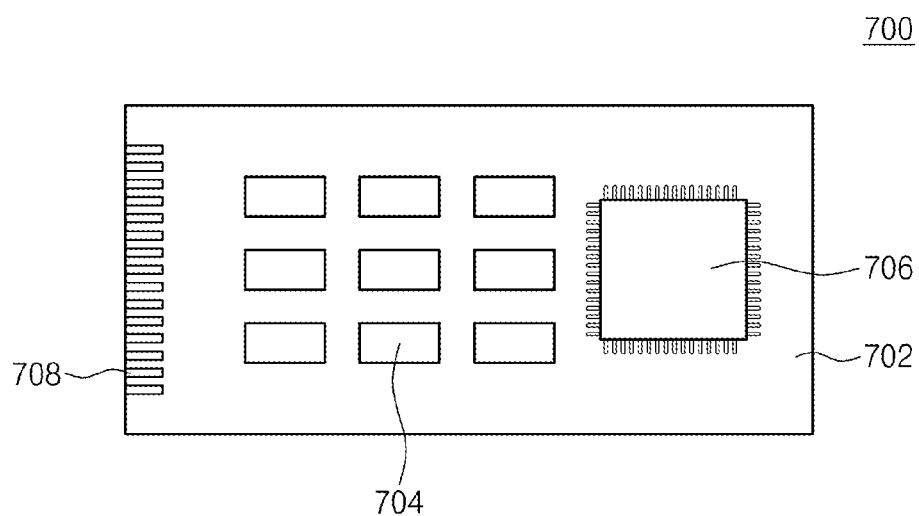
FIG. 12 is a plan view illustrating a package module according to example embodiments.

FIG. 12 is a plan view illustrating a package module 700 according to example embodiments.

Referring to FIG. 12, the package module 700 may include a module substrate 702 having an external connection terminal 708, a semiconductor chip 704 mounted on the module substrate 702, and a semiconductor package 706 in a quad flat package (QFP). The semiconductor chip 704 and/or the semiconductor package 706 may include a semiconductor device according to example embodiments. The package module 700 may be connected to an external electronic device through the external connection terminal 708.

Figure 13:
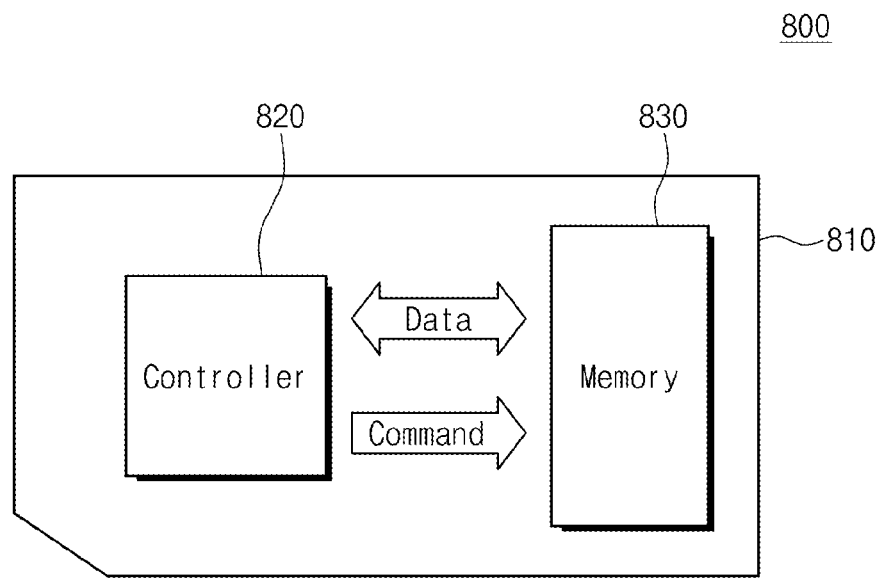
FIG. 13 is a block diagram illustrating a memory card according to example embodiments.

FIG. 13 is a schematic view illustrating a memory card 800 according to example embodiments.

Referring to FIG. 13, the card 800 may include a controller 820 and a memory 830 in a housing 810. The controller 820 and the memory 830 may exchange an electrical signal. For example, the controller 820 and the memory 830 may exchange data according to a command of the controller 820. Therefore, the memory card 800 may store the data in the memory 830 or may output the data from the memory 830.

The controller 820 and/or the memory 830 may include at least one of the semiconductor devices or semiconductor packages according to example embodiments. For example, the controller 820 may include a system-in-package (see 200a of FIG. 9, 200b of FIG. 10 or 200c of FIG. 11), and the memory 830 may include a multichip package (a package that includes a semiconductor device as illustrated in FIG. 7 in which the first semiconductor chips 110a and 110aa are stacked). Also, the controller 820 and/or the memory 830 may be provided as a stack-type package (a package stacked with packages like 200a of FIG. 9, 200b of FIG. 10 or/and 200c of FIG. 11). The memory card 800 may be used as a data storage medium of various portable devices. For example, the card 800 may include a multi media card (MMC) or a security digital (SD) card.

Figure 14:
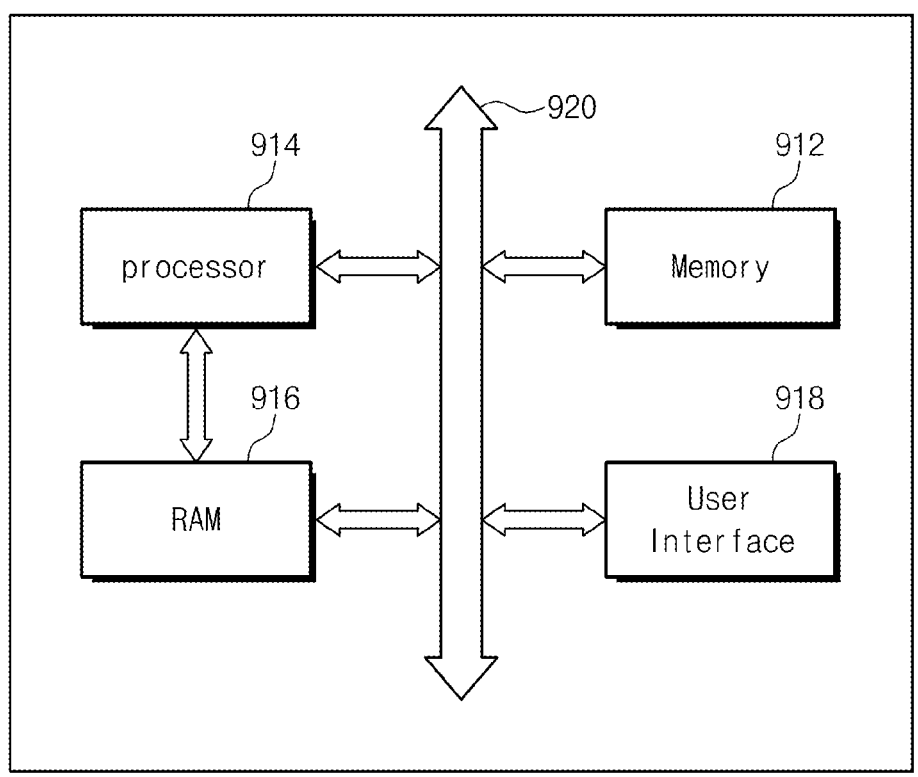
FIG. 14 is a block diagram illustrating an electronic system according to example embodiments.

FIG. 14 is a block diagram illustrating an electronic system 900 according to example embodiments.

Referring to FIG. 14, the electronic system 900 may include at least one of the semiconductor devices or semiconductor packages according to example embodiments. The electronic system 900 may include a mobile device or a computer, etc. For example, the electronic system 900 may include a memory system 912, a processor 914, a random-access memory (RAM) 916, and a user interface 918, which may perform data communications to each other using a bus 920. The processor 914 may execute a program to control the electronic system 900. The RAM 916 may be used as a working memory of the processor 914. For example, the processor 914 and the RAM 916 may include the semiconductor device or semiconductor package according to example embodiments, respectively. Also, the processor 914 and the RAM 916 may be included in one package. The user interface 918 may be used for inputting or outputting data to or from the electronic system 900. The memory system 912 may store a code for operation of the processor 914, data processed by the processor 914, or data input from the outside. The memory system 912 may include a controller and a memory, and may have substantially the same configuration as the memory card 800 of FIG. 13.

Figure 15:
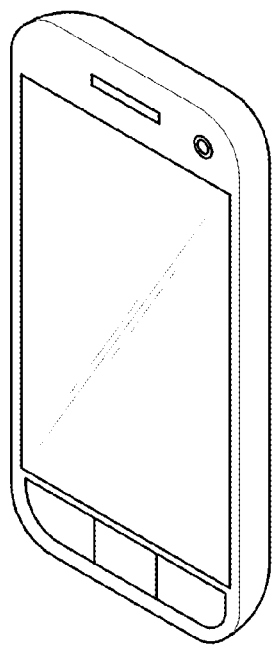
FIG. 15 is a perspective view illustrating an electronic device according to example embodiments.

The electronic system (see 900 of FIG. 14) may be applied to an electronic control device of various electronic devices. FIG. 15 illustrates an example of applying the electronic system (see 900 of FIG. 14) to a mobile phone 1000. In addition, the electronic system (see 900 of FIG. 14) may be applied to a portable notebook, a MP3 player, a navigation, a solid state disk (SSD), and automobile or household appliances.

As described above, according to example embodiments, a plurality of semiconductor devices having different sizes can be stacked because a semiconductor device has through silicon vias having different protrusion heights from each other. Therefore, a semiconductor device including the plurality of semiconductor devices having various sizes and functions and a semiconductor package including the semiconductor device can be provided.

While the inventive concepts have been particularly shown and described with reference to example embodiments thereof, it will be understood by those skilled in the art that various changes in form and details may be made therein without departing from the spirit and scope of the inventive concepts as defined by the appended claims. Example embodiments should be considered in descriptive sense only and not for purposes of limitation.

What is claimed is:

1. A semiconductor device comprising:
a first semiconductor chip including a first through silicon via and a second through silicon via, the first through silicon via having a first protrusion height and the second through silicon via having a second protrusion height different from the first protrusion height;
a second semiconductor chip electrically connected to the first through silicon via; and
a third semiconductor chip electrically connected to the second through silicon via,
wherein the first and second through silicon vias extend below a lower surface of the first semiconductor chip, and
wherein a space is formed between the first semiconductor chip and the second semiconductor chip and between the first semiconductor chip and the third semiconductor chip such that the first through silicon via extends into the space between the first semiconductor chip and the second semiconductor chip and the second through silicon via extends into the space between the first semiconductor chip and the third semiconductor chip.

2. The semiconductor device of claim 1, wherein the second protrusion height is greater than the first protrusion height.

3. The semiconductor device of claim 2, wherein the second through silicon via is farther from a center of the first semiconductor chip than the first through silicon via.

4. The semiconductor device of claim 2, wherein the second through silicon via has a width greater than a width of the first through silicon via.

5. The semiconductor device of claim 1, wherein a plan area of the third semiconductor chip is larger than a plan area of the second semiconductor chip.

6. The semiconductor device of claim 1, further comprising:
an adhesive between the second semiconductor chip and the third semiconductor chip.

7. The semiconductor device of claim 1, wherein the first to third semiconductor chips are different devices from one another among a non-volatile memory device, a dynamic random access memory (DRAM) device, and a logic device.

8. The semiconductor device of claim 1, wherein the first semiconductor chip further includes a third through silicon via having a third protrusion height greater than the second protrusion height.

9. The semiconductor device of claim 8, wherein the third through silicon via is farther from a center of the first semiconductor chip than the second through silicon via.

10. The semiconductor device of claim 8, further comprising:
a fourth semiconductor chip electrically connected to the third through silicon via.

11. The semiconductor device of claim 10, wherein a plan area of the fourth semiconductor chip is larger than a plan area of the third semiconductor chip.

12. A semiconductor package comprising:
a wiring board having a plurality of bonding pads provided on a first surface and at least one ball pad provided on a second surface facing the first surface; and
the semiconductor device of claim 1 attached to the wiring board, wherein,
first ends of the first and second through silicon vias, which face second ends of the first and second through silicon vias electrically connected to the second and third semiconductor chips, are electrically connected to the plurality of bonding pads of the wiring board.

13. The semiconductor package of claim 12, further comprising:
at least one solder ball on the at least one ball pad of the wiring board.

14. The semiconductor package of claim 12, wherein the first ends of the first and second through silicon vias and the bonding pads of the wiring board are electrically connected to each other through connection terminals.

15. The semiconductor package of claim 12, wherein the first ends of the first and second through silicon vias and the bonding pads of the wiring board are electrically connected to each other through bonding wires.

16. A semiconductor device comprising:
a first plurality of through vias extending from an upper surface of a first semiconductor chip to below a lower surface of the first semiconductor chip;
a second plurality of through vias extending from the upper surface of the first semiconductor chip to below the lower surface of the first semiconductor chip;
a second semiconductor chip below the first semiconductor chip; and
a third semiconductor chip below the second semiconductor chip,
wherein the second plurality of through vias are longer than the first plurality of through vias,
wherein bottom ends of the first plurality of through vias are electrically connected to an upper surface of the second semiconductor chip and bottom ends of the second plurality of through vias are electrically connected to an upper surface of the third semiconductor chip, and
wherein a space is formed between the first semiconductor chip and the second semiconductor chip and between the first semiconductor chip and the third semiconductor chip such that the plurality of first through vias extend into the space between the first semiconductor chip and the second semiconductor chip and the plurality of second through vias extend into the space between the first semiconductor chip and the third semiconductor chip.

17. The semiconductor device of claim 16, wherein
the first plurality of through vias are electrically connected to the upper surface of the second semiconductor chip by a plurality of pads arranged on the upper surface of the second semiconductor chip, and
the second plurality of through vias are electrically connected to the upper surface of the third semiconductor chip by a plurality of pads arranged on the upper surface of the third semiconductor chip.

18. The semiconductor device of claim 17, wherein the second plurality of through vias are arranged further from a center of the first semiconductor chip than the first plurality of through vias.

19. The semiconductor device of claim 17, wherein a width of the third semiconductor chip is greater than a width of the second semiconductor chip.

* * * * *